(12) United States Patent
Guo et al.

(10) Patent No.: US 10,483,830 B2
(45) Date of Patent: Nov. 19, 2019

(54) MAGNETIC SENSOR INTEGRATED CIRCUIT AND MOTOR COMPONENT

(71) Applicant: Johnson Electric S.A., Murten (CH)

(72) Inventors: Hui Min Guo, Hong Kong (CN); Shu Zuo Lou, Hong Kong (CN); Xiao Ming Chen, Hong Kong (CN); Guang Jie Cai, Hong Kong (CN); Chun Fai Wong, Hong Kong (CN)

(73) Assignee: JOHNSON ELECTRIC INTERNATIONAL AG, Murten (CH)

( * ) Notice: Subject to any disclaimer, the term of this patent is extended or adjusted under 35 U.S.C. 154(b) by 5 days.

(21) Appl. No.: 15/488,061

(22) Filed: Apr. 14, 2017

(65) Prior Publication Data

US 2017/0317559 A1 Nov. 2, 2017

(30) Foreign Application Priority Data

Apr. 28, 2016 (CN) .......................... 2016 1 0280725
Jun. 2, 2016 (CN) .......................... 2016 1 0392812

(51) Int. Cl.
| | |
|---|---|
| *H02K 11/20* | (2016.01) |
| *H01L 27/22* | (2006.01) |
| *G01R 33/00* | (2006.01) |
| *G01R 19/165* | (2006.01) |
| *H02P 6/26* | (2016.01) |
| *H01L 43/02* | (2006.01) |
| *H02K 11/33* | (2016.01) |
| *H02K 3/28* | (2006.01) |

(52) U.S. Cl.
CPC ........... *H02K 11/20* (2016.01); *G01R 19/165* (2013.01); *G01R 33/0023* (2013.01); *H01L 27/22* (2013.01); *H01L 43/02* (2013.01); *H02K 11/33* (2016.01); *H02P 6/26* (2016.02); *H02K 3/28* (2013.01)

(58) Field of Classification Search
CPC ................................. H02K 3/28; H02K 11/20
USPC ........................................ 318/400.38; 310/184
See application file for complete search history.

(56) References Cited

U.S. PATENT DOCUMENTS

| | | | | |
|---|---|---|---|---|
| 6,097,127 | A  * | 8/2000 | Rivera | ...................... H02K 3/28 |
| | | | | 310/184 |
| 2004/0008026 | A1 * | 1/2004 | Kawase | ............... G01R 33/028 |
| | | | | 324/249 |

\* cited by examiner

*Primary Examiner* — Bickey Dhakal
*Assistant Examiner* — Zemenay T Truneh
(74) *Attorney, Agent, or Firm* — Muncy, Geissler, Olds & Lowe, P.C.

(57) ABSTRACT

A magnetic sensor integrated circuit and a motor component are provided. The integrated circuit includes a housing, a semiconductor substrate arranged inside the housing, input ports and an output port which extend out from the housing, and an electronic circuit arranged on the semiconductor substrate. The electronic circuit includes a magnetic field detection circuit configured to detect and output a magnetic field inductive signal corresponding to an external magnetic field, and a voltage detection circuit configured to detect a specific voltage and output, in a case that the specific voltage reaches a predetermined value, a control signal for controlling the magnetic sensor integrated circuit to perform a preset action. The voltage detection circuit and the magnetic field detection circuit operate simultaneously.

20 Claims, 7 Drawing Sheets

US 10,483,830 B2

MAGNETIC SENSOR INTEGRATED CIRCUIT AND MOTOR COMPONENT

CROSS REFERENCE TO RELATED APPLICATIONS

This non-provisional patent application claims priorities under 35 U.S.C. § 119(a) from Patent Application No. CN201610280725.X, filed in The People's Republic of China on 28 Apr. 2016 and Patent Application No. CN201610392812.4, filed in The People's Republic of China on 2 Jun. 2016.

TECHNICAL FIELD

The present disclosure relates to the technical field of electronic circuit, and in particular to a magnetic sensor integrated circuit.

BACKGROUND

Magnetic sensors are widely used in modern industries and electronic products to induce a magnetic field strength for measuring physical parameters such as current, position and direction. Motor industry is an important application field of the magnetic sensors. In a motor, a magnetic sensor may serve as a position sensor for a pole of a rotor.

In the conventional technology, a magnetic sensor is generally powered by a stable direct current power supply, and a magnetic field detection circuit is arranged inside the magnetic sensor to detect an external magnetic field and output a detection result of the magnetic field. Usually, when the direct current power supply provides power for the magnetic sensor, the magnetic field detection circuit inside the magnetic sensor starts to operate and outputs the detection result to an outside, and no other control is performed in the magnetic sensor.

SUMMARY

The present disclosure is to provide a new magnetic sensor integrated circuit, to expand functions of a conventional magnetic sensor.

In an aspect, a magnetic sensor integrated circuit is provided according to an embodiment of the present disclosure. The magnetic sensor integrated circuit includes a housing, a semiconductor substrate arranged inside the housing, input ports and an output port which extend out from the housing, and an electronic circuit arranged on the semiconductor substrate. The electronic circuit includes:
 a magnetic field detection circuit, configured to detect and output a magnetic field inductive signal corresponding to an external magnetic field; and
 a voltage detection circuit, configured to detect a specific voltage, and output, in a case that the specific voltage reaches a predetermined value, a control signal for controlling the magnetic sensor integrated circuit to perform a preset action;
 where the voltage detection circuit and the magnetic field detection circuit operate simultaneously.

Preferably, in the magnetic sensor integrated circuit described above, the specific voltage is a supply voltage for the magnetic field detection circuit.

Preferably, in the magnetic sensor integrated circuit described above, the predetermined value is greater than a supply voltage value that enables the magnetic field detection circuit to operate normally.

Preferably, in the magnetic sensor integrated circuit described above, the voltage detection circuit at least includes a comparator.

An input terminal of the comparator receives the specific voltage, and the other input terminal of the comparator receives a reference voltage. The comparator is configured to output, in a case that the specific voltage is higher than the reference voltage, the control signal for controlling the magnetic sensor integrated circuit to perform a specific action.

Preferably, in the magnetic sensor integrated circuit described above, the voltage detection circuit includes:
 a first resistor and a second resistor connected in series between the specific voltage and the ground;
 a buffer, where a non-inverting input terminal of the buffer is connected to a common terminal of the first resistor and the second resistor, and an inverting input terminal of the buffer is connected to an output terminal of the buffer; and
 a comparator, where a non-inverting input terminal of the comparator is connected to the output terminal of the buffer, and an inverting input terminal of the comparator is connected to a reference voltage.

Preferably, in the magnetic sensor integrated circuit described above, the electronic circuit further includes an output control circuit configured to control, at least based on the magnetic field inductive signal, the magnetic sensor integrated circuit to operate in at least one of a first state in which a current flows from the output port to an outside and a second state in which a current flows into the output port from the outside.

Preferably, in the magnetic sensor integrated circuit described above, the input port includes an input port for connecting an external alternating current power supply. The output control circuit is configured to control, based on a polarity change of the alternating current power supply and the magnetic field inductive signal, the integrated circuit to switch at least between the first state and the second state.

Preferably, in the magnetic sensor integrated circuit described above, the output control circuit includes a first switch and a second switch. The first switch and the output port are connected in a first current path, and the second switch and the output port are connected in a second current path having a direction opposite to that of the first current path. The first switch and the second switch are selectively turned on under the control of the magnetic field inductive signal.

Preferably, in the magnetic sensor integrated circuit described above, the output control circuit includes a first current path in which a current flows out from the output port, a second current path in which a current flows in from the output port, and a switch connected in one of the first current path and the second current path, wherein the switch is controlled by the magnetic field detection information outputted by the magnetic field detection circuit, and allows the first current path and the second current path to be selectively turned on.

Preferably, in the magnetic sensor integrated circuit described above, the electronic circuit further includes a state control circuit. The state control circuit is configured to control the output control circuit. In a case that the magnetic sensor integrated circuit meets a predetermined condition, the output control circuit is controlled to operate, at least in response to the magnetic field inductive signal, in at least one of the first state in which a load current flows from the output port to the outside and the second state in which a load current flows into the output port from the outside. In a case that the magnetic sensor integrated circuit does not meet the predetermined condition, the output control circuit is controlled to operate in a third state in which the first state and the second state are prevented.

Preferably, in the magnetic sensor integrated circuit described above, in a case that the output control circuit operates in the third state, the output control circuit makes no response to the magnetic field inductive signal, or a current at the output port is lower than one fourth of the load current.

Preferably, in the magnetic sensor integrated circuit described above, the magnetic field detection circuit includes:
- a magnetic sensing unit, configured to detect and output an analog electrical signal matching the external magnetic field;
- a signal processing unit, configured to perform amplification and interference cancellation on the analog electrical signal; and
- an analog-to-digital conversion unit, configured to convert the analog electric signal, on which the amplification and the interference cancellation have been performed, into the magnetic field inductive signal.

Preferably, in the magnetic sensor integrated circuit described above, the state control circuit includes a delay circuit. The delay circuit is configured to start time counting on obtaining the control signal; output a signal indicating that the magnetic sensor integrated circuit meets the predetermined condition, in a case that the counted time reaches a predetermined time; and output a signal indicating that the magnetic sensor integrated circuit does not meet the predetermined condition, in a case that the counted time does not reach the predetermined time.

Preferably, in the magnetic sensor integrated circuit described above, the electronic circuit further includes a power supply module. The power supply module includes a rectifier configured to convert an external power supply to a first voltage, and a voltage regulating circuit configured to regulate the first voltage to a second voltage. The magnetic sensor integrated circuit is powered by the second voltage.

In another aspect, a motor component is provided according to an embodiment of the present disclosure, which includes a motor and a motor drive circuit. The motor drive circuit includes the magnetic sensor integrated circuit according to any of the above descriptions.

Preferably, in the motor component described above, the motor drive circuit further includes a bi-directional switch connected in series with the motor across an external alternating current power supply. The output port of the magnetic sensor integrated circuit is connected to a control terminal of the bi-directional switch.

Preferably, in the motor component described above, the motor includes a stator and a permanent magnetic rotor. The stator includes a stator core and a single-phase winding wound on the stator core.

Preferably, in the motor component described above, the motor component further includes a step-down transformer configured to drop a voltage of the power supply of the motor and provide the dropped voltage to the magnetic sensor integrated circuit.

Preferably, in the motor component described above, a voltage drop across the step-down transformer is higher than the supply voltage for the magnetic field detection circuit in the magnetic sensor integrated circuit.

Preferably, in the motor component described above, the magnetic sensor integrated circuit is configured to control the bi-directional switch to be turned on in a case that the alternating current power supply is in a positive half-cycle and a magnetic field of the rotor of the motor has a first polarity or in a case that the alternating current power supply is in a negative half-cycle and the magnetic field of the rotor of the motor has a second polarity opposite to the first polarity, and to control the bi-directional switch to be turned off in a case that the alternating current power supply is in a negative half-cycle and the magnetic field of the rotor of the motor has the first polarity or in a case that the alternating current power supply is in a positive half-cycle and the magnetic field of the rotor of the motor has the second polarity.

Preferably, in the motor component described above, the magnetic sensor integrated circuit is configured to control a current to flow from the integrated circuit to the bi-directional switch in a case that a signal outputted by the alternating current power supply is in a positive half-cycle and the magnetic field of the rotor of the motor has the first polarity, and to control a current to flow from the bi-directional switch to the integrated circuit in a case that the signal outputted by the alternating current power supply is in a negative half-cycle and the magnetic field of the permanent magnetic rotor of the motor has the second polarity opposite to the first polarity.

In still another aspect, an application device including the motor component described above is provided according to an embodiment of the present disclosure.

Preferably, the application device is a pump, a fan, a household appliance or a vehicle.

The magnetic sensor integrated circuit according to the embodiments of the present disclosure expands functions of a conventional magnetic sensor, which can perform a preset internal control based on detection of the specific voltage while a fast response speed of the magnetic sensor integrated circuit is ensured.

BRIEF DESCRIPTION OF THE DRAWINGS

To illustrate technical solutions in embodiments of the present disclosure or in the conventional technology more clearly, drawings used in the descriptions of the embodiments or the conventional technology are described briefly hereinafter. Apparently, the drawings described hereinafter merely illustrate some embodiments of the present disclosure, and other drawings may be obtained by those skilled in the art based on those drawings without creative efforts.

DETAILED DESCRIPTION OF THE EMBODIMENTS

Technical solutions in embodiments of the present disclosure are described clearly and completely hereinafter in conjunction with the drawings of the embodiments of the present disclosure. Apparently, the described embodiments are only a few rather than all of the embodiments of the invention. All other embodiments obtained by those skilled in the art based on the embodiments of the present disclosure without creative efforts shall fall within the protection scope of the present disclosure.

Figure 1:
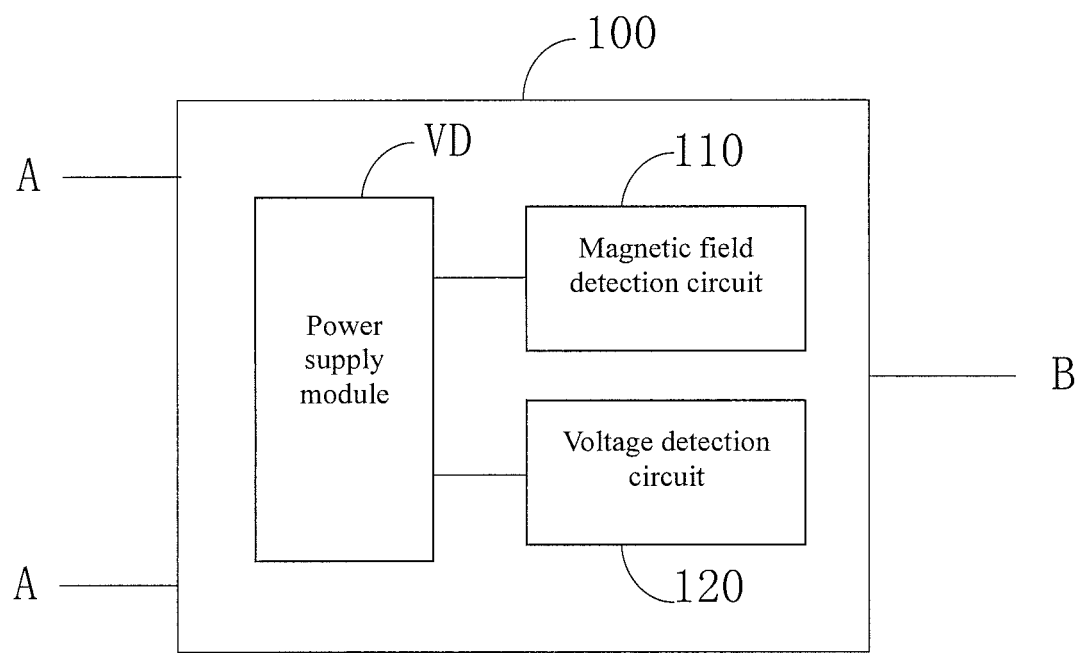
FIG. 1 is a schematic structural diagram of a magnetic sensor integrated circuit according to an embodiment of the present disclosure.

As shown in FIG. 1, a magnetic sensor integrated circuit according to an embodiment of the present disclosure includes a housing 100, a semiconductor substrate arranged inside the housing, input ports A and an output port B which extend out from the housing, and an electronic circuit arranged on the semiconductor substrate. The electronic circuit includes a magnetic detection circuit 110 and a voltage detection circuit 120.

The magnetic detection circuit 110 is configured to detect and output a magnetic field inductive signal corresponding to an external magnetic field.

The voltage detection circuit 120 is configured to detect a specific voltage, and output, in a case that the specific voltage reaches a predetermined value, a control signal for controlling the magnetic sensor integrated circuit to perform a preset action.

The magnetic sensor integrated circuit according to the embodiment of the present disclosure is provided with the voltage detection circuit, on the basis of the magnetic detection circuit included in a conventional magnetic sensor integrated circuit. In this way, the magnetic sensor integrated circuit can perform a preset internal control based on detection of the specific voltage. Therefore, the magnetic sensor integrated circuit has a fast response speed.

In the present disclosure, the specific voltage and the predetermined value may be set according to a specific application of the voltage detection circuit 120. For example, in a preferred embodiment, the predetermined value may be set to a value greater than a voltage value that enables the magnetic field detection circuit to operate normally (normally operating refers to that a correct magnetic field inductive signal can be generated). That is, the voltage detection circuit outputs the control signal for controlling the magnetic sensor integrated circuit to perform the preset action when the specific voltage detected by the voltage detection circuit is higher than the voltage value that enables the magnetic field detection circuit to operate normally.

Reference is made to FIG. 1, in another embodiment of the present disclosure, the magnetic sensor integrated circuit may further include a power supply module VD configured to provide a supply voltage for the magnetic field detection circuit 110 and the voltage detection circuit 120.

Further, a detection object of the voltage detection circuit 120 according to the embodiments of the present application may be flexibly set according to a specific application of the voltage detection circuit 120. That is, a point in the magnetic sensor integrated circuit may be selected as a sampling point of the voltage detection circuit based on an application of the voltage detection circuit 120, and a voltage at the point is the specific voltage. For example, the specific voltage may be the supply voltage for the magnetic field detection circuit.

Specifically, in collecting the specific voltage, the voltage detection circuit 120 may detect the specific voltage directly, or determine magnitude of the specific voltage by detecting a fraction of the specific voltage.

It can be understood that, in an embodiment, in the magnetic sensor integrated circuit according to the embodiment of the present disclosure, the voltage detection circuit 120 may at least include a comparator. An input terminal of the comparator receives the specific voltage, and the other input terminal receives a reference voltage. The comparator is configured to output, in a case that the specific voltage is determined to be higher than the reference voltage, the control signal for controlling the magnetic sensor integrated circuit to perform the specific action.

Figure 2:
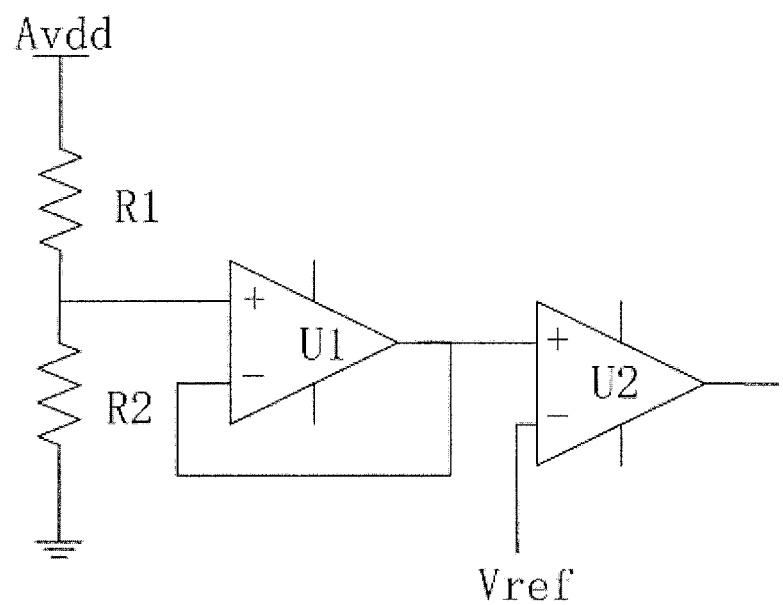
FIG. 2 is a schematic structural diagram of a voltage detection circuit of a magnetic sensor integrated circuit according to an embodiment of the present disclosure.

Preferably, as shown in FIG. 2, in a specific implementation, the voltage detection circuit 120 may include a first resistor R1, a second resistor R2, a buffer U1 and a comparator U2.

The first resistor R1 and the second resistor R2 are connected in series between the specific voltage (Avdd) and the ground.

A non-inverting input terminal of the buffer U1 is connected to a common terminal of the first resistor R1 and the second resistor R2. An inverting input terminal of the buffer U1 is connected to an output terminal of the buffer U1.

A non-inverting input terminal of the comparator U2 is connected to the output terminal of the buffer R1. An inverting input terminal of the comparator U2 is connected to a reference voltage Vref.

The buffer U1 may be a negative feedback amplifier circuit. The comparator U2 may be a hysteresis comparator. The negative feedback amplifier circuit may be implemented with a conventional circuit design method.

Figure 3:
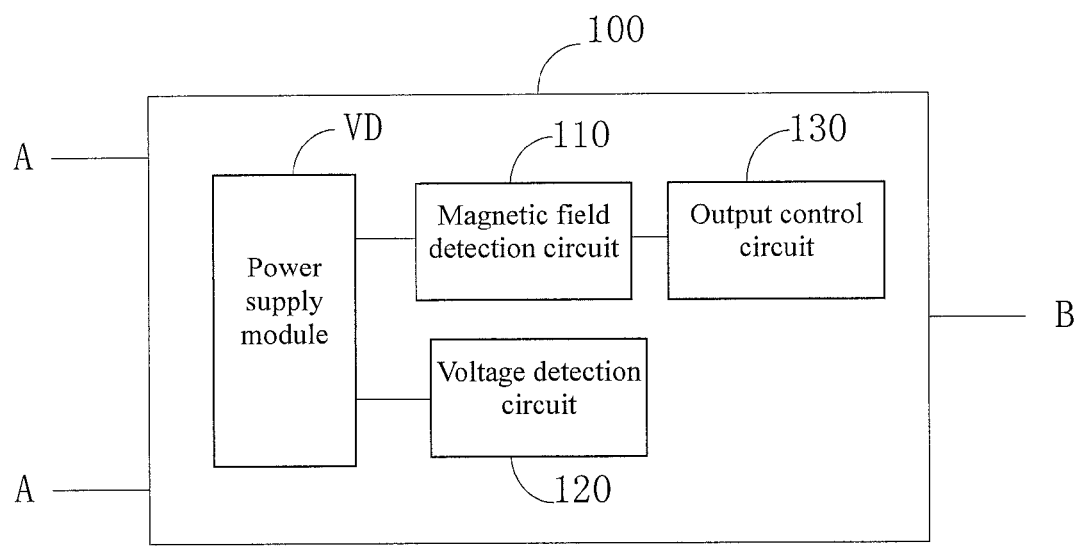
FIG. 3 is a schematic structural diagram of a magnetic sensor integrated circuit according to another embodiment of the present disclosure.

Another embodiment of the present disclosure is described hereinafter in conjunction with a specific application of the voltage detection circuit 120. Reference is made to FIG. 3. In the embodiment, the electronic circuit may further include an output control circuit 130. The output control circuit 130 is configured to control, at least based on the magnetic field inductive signal, the magnetic sensor integrated circuit to operate in at least one of a first state in which a current flows from the output port B to an outside and a second state in which a current flows into the output port B from the outside.

In the magnetic sensor integrated circuit according to the embodiments, a power mode for the magnetic sensor integrated circuit may be selected according to design requirements. In a preferred embodiment, an alternating current power supply may be adopted to provide power. In this case, the input ports A may include an input port for connecting the external alternating current power supply, and the output control circuit 130 may be configured to control, based on a polarity change of the alternating current power supply and the magnetic field inductive signal, the integrated circuit to switch at least between the first state and the second state.

It should be noted that, according to the embodiments of the disclosure, the magnetic sensor integrated circuit switches operations between the first state and the second state, which is not limited to a case that the magnetic sensor integrated circuit switches to the other state immediately after one state ends, but further includes a case that the magnetic sensor integrated circuit switches to the other state in a certain time interval after one state ends. According to a preferable embodiment, there is no output at the output port of the magnetic sensor integrated circuit in the certain time interval between the two states.

In a case that the integrated circuit according to the above embodiments of the present application is adopted, in order to prevent the integrated circuit from outputting an error signal, a predetermined condition may be set in advance. For example, the predetermined condition may be that a preset time is delayed after the specific voltage reaches the predetermined value. In a case that the magnetic sensor integrated circuit meets the predetermined condition, the output control circuit is controlled to operate, at least in response to the magnetic field inductive signal, in at least one of the first state in which a load current flows from the output port to the outside and the second state in which a load current flows into the output port from the outside. In a case that the integrated circuit does not meet the predetermined condition, the output control circuit 130 is prevented from operating in a state in which a load current flows through the output port B.

The "operating in a state in which a load current flows through the output port B" in the above embodiment may refer to operating in the first state in which the load current flows to the outside from the output port B, or operating in the second state in which the load current flows into the output port B from the outside, or may refer to alternatively operating in the first state and the second state. Therefore, in another embodiment of the present disclosure, the output control circuit 130 may be further configured to operate, at least in response to the magnetic field inductive signal, in at least one of the first state in which the load current flows from the output port B to the outside and the second state in which the load current flows into the output port B from the outside, in a case that the magnetic sensor integrated circuit meets the predetermined condition, and to operate in a third state in which the first state and the second state are prevented, in a case that the magnetic sensor integrated circuit does not meet the predetermined condition.

Figure 4:
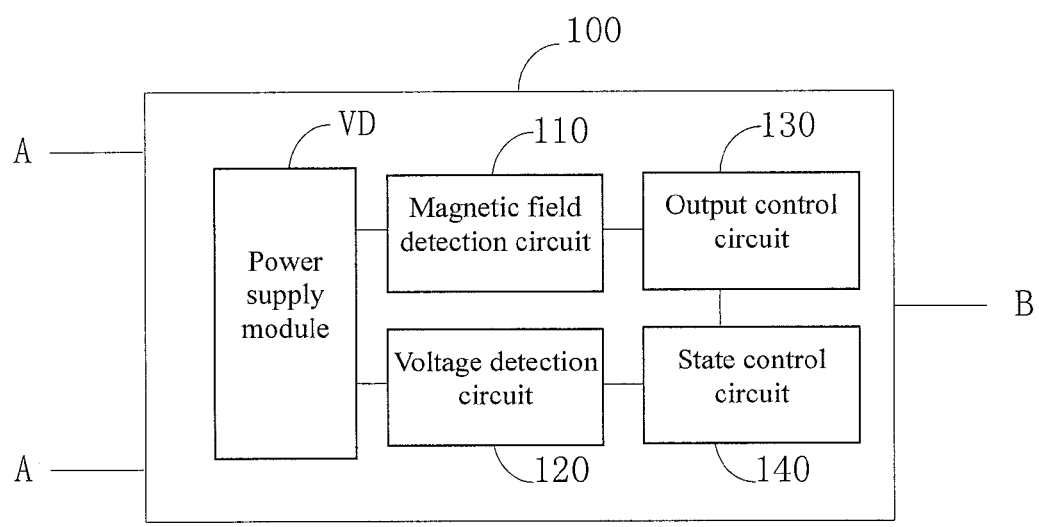
FIG. 4 is a schematic structural diagram of a magnetic sensor integrated circuit according to still another embodiment of the present disclosure.

Preferably, as shown in FIG. 4, in the technical solutions in the above embodiments of the present application, the magnetic sensor integrated circuit may further include a state control circuit 140 configured to determine whether the magnetic sensor integrated circuit meets the predetermined condition. An operating state of the output control circuit 130 is controlled via the state control circuit 140. In this case, as shown in FIG. 4, the electronic circuit 100 includes the magnetic field detection circuit 110, the voltage detection circuit 120, the output control circuit 130 connected between the magnetic field detection circuit 110 and the output port B and the state control circuit 140 connected to the output control circuit 130 and the voltage detection circuit 120.

The state control circuit 140 is configured to control the output control circuit 130. In a case that the magnetic sensor integrated circuit meets the predetermined condition (the specific voltage reaches the predetermined value for the preset time), the output control circuit is controlled to operate, at least in response to the magnetic field inductive signal, in at least one of the first state in which the load current flows from the output port to the outside and the second state in which the load current flows into the output port from the outside. In a case that the magnetic sensor integrated circuit does not meet the predetermined condition, the output control circuit 130 is controlled to operate in the third state in which the first state and the second state are prevented.

It can be understood that, specific configuration of the output control circuit 130 may be set according to device requirements corresponding to the magnetic sensor integrated circuit when designing the circuit. For example, the output control circuit 130 may have an operating state and a high impedance state. The operating state refers to the first state or the second state, and the high impedance state refers to the third state. In a case that the output control circuit 130 is set to have only one operating state, the output control circuit 130 may be configured to operate in at least an operating state matching the magnetic inductive signal in a case that the magnetic sensor integrated circuit meets the predetermined condition. The operating state matching the magnetic inductive signal refers to the first state or the second state currently set for the output control circuit 130, and the first state and the second state each may match only one polarity of the external magnetic field. For example, the first state matches the magnetic field inductive signal only when the external magnetic field has a first polarity, and the second state matches the magnetic field inductive signal only when the external magnetic field has a second polarity opposite to the first polarity. In this case, the magnetic sensor integrated circuit may allow the load current flow through the output port B only in a case that the external magnetic field has the first polarity (or the second polarity), and may prevent the load current from flowing through the output port B in a case that the magnetic sensor integrated circuit does not meet the predetermined condition or the external magnetic field has the second polarity (or the first polarity). As another implementation, the output control circuit 130 may also be set to have the first state, the second state and the third state. In this case, the output control circuit 130 may be configured: to control, at least in response to the magnetic inductive signal, the magnetic sensor integrated circuit to switch at least between the first state and the second state, in a case that the magnetic sensor integrated circuit meets the predetermined condition. That is, one polarity of the external magnetic field corresponds to one magnetic inductive signal, and the first state and the second state respectively correspond to one magnetic inductive signal. Since the operating state of the output control circuit 130 may be controlled to vary with the polarity change of the external magnetic field, the output control circuit 130 can be controlled to switch between the first state and the second state based on the polarity of the external magnetic field.

In the magnetic sensor integrated circuit according to the above embodiments of the present application, a type of the third state of the output control circuit 130 may be set based on user requirements, as long as the output control circuit 130 can be prevented from entering the first state and the second state. For example, when the output control circuit 130 operates in the third state, the output control circuit makes no response to the magnetic field inductive signal, or a current at the output port B is much lower than the load current (for example, lower than one fourth of the load current, in this case, the current is substantially negligible with respect to the load current) and cannot drive the outside load.

Figure 5:
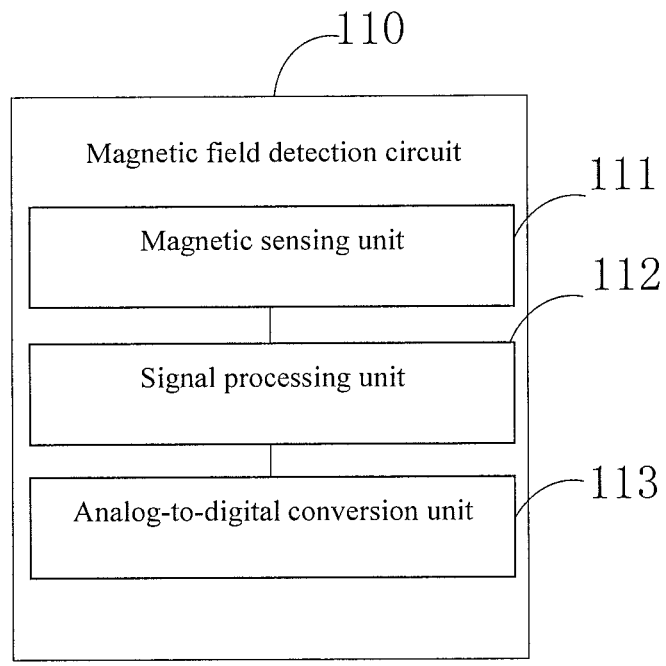
FIG. 5 is a schematic structural diagram of a magnetic field detection circuit according to an embodiment of the present disclosure.

In the technical solution according to the above embodiments of the present application, the magnetic field detection circuit 110 may be flexibly designed according to user requirements. Reference is made to FIG. 5. In a preferred embodiment, the magnetic field detection circuit 110 may include a magnetic sensing unit 111, a signal processing unit 112 and an analog-to-digital conversion unit 113.

The magnetic sensing unit 111 is configured to detect and output an analog electrical signal matching the external magnetic field, where the magnetic sensing unit 111 may be a Hall plate in the embodiment of the present disclosure;

The signal processing unit 112 is configured to perform amplification and interference cancellation on the analog electrical signal to improve accuracy of the detected signal.

The analog-to-digital conversion unit 113 is configured to convert the analog electric signal, on which the amplification and the interference cancellation have been performed, into the magnetic field inductive signal, where the magnetic field inductive signal may be a switch-type digital signal for an application of simply identifying the polarity of the external magnetic field needs.

Figure 6:
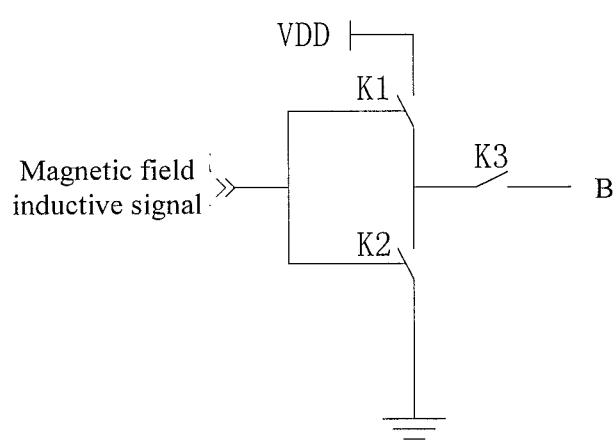
FIG. 6 is a schematic structural diagram of an output control circuit according to an embodiment of the present disclosure.

In the magnetic sensor integrated circuit according to the above embodiments of the present application, a specific circuit structure of the output control circuit 130 may be flexibly designed based on configuration requirements as long as it is ensured that the output control circuit 130 can realize the above-described configuration functions. In an implementation of the output control circuit 130, as shown in FIG. 6, the output control circuit 130 may include a first switch K1 and a second switch K2. The first switch K1 and the output port B are connected in a first current path, and the second switch K2 and the output port B are connected in a second current path having a direction opposite to that of the first current path. The first switch K1 and the second switch K2 are selectively turned on under the control of the magnetic field inductive signal. There is a connection point between the first current path and the second current path, and the third switch K3 is connected between the connection point and the output port B. The third switch K3 is turned on in a case that the magnetic sensor integrated circuit meets the predetermined condition, and the third switch K3 is turned off in a case that the magnetic sensor integrated circuit does not meet the predetermined condition. Specifically, types of the first switch K1 and the second switch K2 may be selected based on user requirements, as long as it is ensured that the first switch K1 and the second switch K2 can be selectively turned on under the control of the magnetic field inductive signal to correspondingly turn on the first current path or the second current path. For example, as shown in FIG. 6, the first switch 31 and the second switch 32 are a pair of complementary semiconductor switches. The first switch K1 may be a switch turned on at a high level, and the second switch K2 may be a switch turned on at a low level. Control terminals of the two switches are connected to the magnetic field inductive signal. A current input terminal of the first switch K1 is connected to a high voltage (for example, a direct current power supply), and a current output terminal of the first switch K1 is connected to a current input terminal of the second switch K2. A current output terminal of the second switch K2 is connected to a low voltage (for example, the ground). The third switch K3 is arranged between a connection point, of the current output terminal of the first switch K1 and the current input terminal of the second switch K2, and the output port B. In a case that the third switch K3 is turned on, and if the magnetic field inductive signal outputs a high level, the first switch K1 is turned on, the second switch K2 is turned off, and the load current flows from the high voltage to the outside through the first switch K1, the third switch K3 and the output port B; and if the magnetic field inductive signal outputs a low level, the second switch K2 is turned on, the first switch K1 is turned off, the load current flows from the outside into the output port B and flows through the third switch K3 and the second switch K2 in sequence. According to the embodiment shown in FIG. 6, the first switch 31 is a p-channel metal oxide semiconductor field effect transistor (P-Channel MOSFET), and the second switch 32 is an n-channel metal oxide semiconductor field effect transistor (N-Channel MOSFET). It should be understood that, in other embodiments, the first switch and the second switch may be other types of semiconductor switches, e.g., other field effect transistors such as a junction field effect transistor (JFET) or a metal semiconductor field effect transistor (MESFET).

The output control circuit comprises a first current path in which a current flows out from the output port, a second current path in which a current flows in from the output port, and a switch connected in one of the first current path and the second current path. The switch is controlled by the magnetic field detection information outputted by the magnetic field detection circuit, and allows the first current path and the second current path to be selectively turned on. Preferably, no switch is provided in the other one of the first current path and the second current path.

Figure 7:
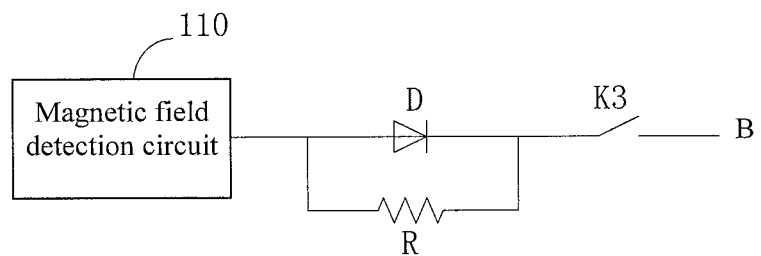
FIG. 7 is a schematic structural diagram of an output control circuit according to another embodiment of the present disclosure.

FIG. 7 schematically illustrates another implementation of the output control circuit 130, which includes a unidirectional switch D. The unidirectional switch D and the output port B are connected in a first current path. A current input terminal of the unidirectional switch D may be connected to an output terminal of the magnetic field detection circuit 110. The output terminal of the magnetic field detection circuit 110 may be connected to the output port B via a resistor R, in a second current path having a direction opposite to that of the first current path. There is a connection point between the first current path and the second current path. The third switch K3 is connected between the connection point and the output port B. In a case that the magnetic sensor integrated circuit meets the predetermined condition, the third switch K3 is turned on. In a case that the magnetic sensor integrated circuit does not meet the predetermined condition, the third switch K3 is turned off. The unidirectional switch D is turned on in a case that the magnetic field inductive signal is at a high level, and the load current flows to the outside through the unidirectional switch D, the third switch K3 and the output port B. In a case that the magnetic field inductive signal is at a low level, the unidirectional switch D is turned off, and the load current flows from the outside to the output port B and flows through the third switch K3 and the resistor R in sequence. As an alternative, the resistor R1 in the second current path may be replaced with another unidirectional switch in anti-parallel with the unidirectional switch D. In this way, a load current flowing from the output port and a load current flowing to the output port are balanced.

It can be understood that the third switch K3 may be connected between the output terminal of the magnetic field detection circuit 110 and the first or second current path. In a case that the magnetic sensor integrated circuit does not meet the predetermined condition, the third switch K3 is turned off. In this case, the control circuit 130 makes no response to the magnetic field inductive signal.

Figure 8:
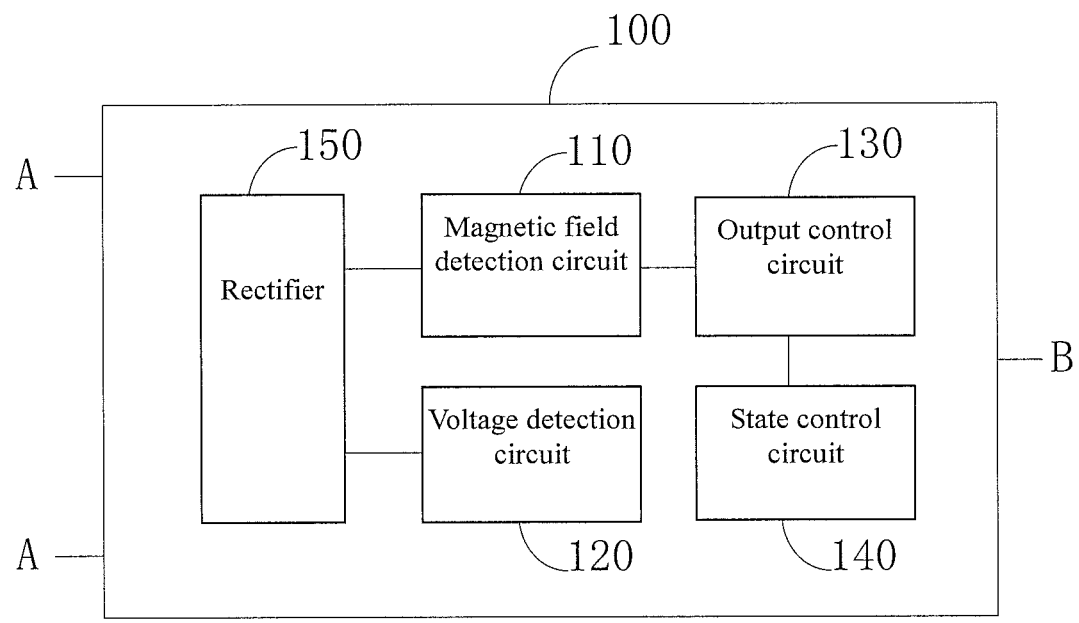
FIG. 8 is a schematic structural diagram of a magnetic field detection circuit according to another embodiment of the present disclosure.

In a preferred embodiment, a power supply of the magnetic sensor integrated circuit may be an alternating current power supply. Reference is made to FIG. 8. The input port is for connecting the external alternating current power supply. In the magnetic sensor integrated circuit, the power supply module may include a rectifier 150 connected to the input port, and the rectifier can convert an alternating current power into a direct current power. In this case, power of the magnetic field detection circuit 110, the voltage detection circuit 120, the state control circuit 140 and the output control circuit 130 may be directly or indirectly from an output voltage of the rectifier 150.

Figure 9:
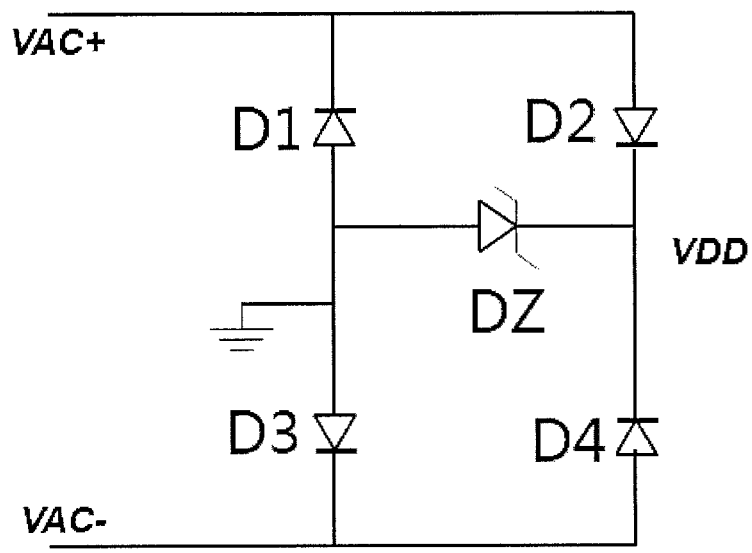
FIG. 9 is a schematic structural diagram of a rectifier according to an embodiment of the present disclosure.

FIG. 9 illustrates a preferred implementation of the rectifier 150. The rectifier 150 includes a full wave rectifying bridge and a voltage stabilization unit connected to the full wave rectifying bridge. The full wave rectifying bridge is configured to convert an alternating current signal outputted by the alternating current power supply into a direct current signal. The voltage stabilization unit is configured to stabilize the direct current signal outputted by the full wave rectifying bridge within a preset range. The voltage stabilization unit includes a Zener diode connected between two output terminals of the full wave rectifying bridge. The full wave rectifying bridge includes a first diode D1 and a second diode D2 connected in series, and a third diode D3 and a fourth diode D4 connected in series. A common terminal of the first diode D1 and the second diode D2 is electrically connected to a first input port VAC+, and a common terminal of the third diode D3 and the fourth diode D4 is electrically connected to a second input port VAC−.

An input terminal of the first diode D1 is electrically connected to an input terminal of the third diode D3 to form a grounded output terminal of the rectifying bridge. An output terminal of the second diode D2 is electrically connected to an output terminal of the fourth diode D4 to form a voltage output terminal VDD of the rectifying bridge. The Zener diode DZ is connected between, the common terminal of the second diode D2 and the fourth diode D4, and the common terminal of the first diode D1 and the third diode D3. In a preferred embodiment, a power terminal of the output control circuit 120 may be electrically connected to the voltage output terminal of the full wave rectifying bridge directly.

In the case that the magnetic sensor integrated circuit according to the embodiment is powered by the alternating current power supply, the output control circuit 130 can also respond to an electric polarity of the alternating current power supply, in addition to responding to the magnetic field inductive signal. That is, in a case that the magnetic sensor integrated circuit meets the predetermined condition, the output control circuit 130 is controlled to operate, at least in response to the magnetic field inductive signal and a polarity signal of the alternating current power supply, in at least one of the first state in which the load current flows from the output port B to the outside and the second state in which the load current flows into the output port B from the outside. Preferably, the output control circuit 130 may be configured to control, in response to the polarity of the alternating current power supply and the magnetic field polarity represented by the magnetic field inductive signal, the magnetic sensor integrated circuit to switch between the first state and the second state, in a case that the magnetic sensor integrated circuit meets the predetermined condition.

As a specific embodiment, the output control circuit 130 may be configured to in a case that the magnetic sensor integrated circuit meets the predetermined condition, control the load current to flow from the output port B to the outside, if the magnetic field polarity represented by the magnetic field inductive signal is a first magnetic polarity and the electric polarity of the alternating current power supply is a first electric polarity; and control the load current to flow into the output port B from the outside, if the magnetic field polarity represented by the magnetic field inductive signal is a second magnetic polarity opposite to the first magnetic polarity and the electric polarity of the alternating current power supply is a second electric polarity opposite to the first electric polarity. It should be understood that, the situation that the integrated circuit has a flowing current in a case that the polarity of the permanent magnetic rotor is the first polarity and the alternating current power supply is in the first electric polarity and, or in a case that the polarity of the permanent magnetic rotor is the second polarity and the alternating current power supply is in the second electric polarity, may be a situation that the integrated circuit has a flowing current during entire periods in the two cases, or may be a situation that the integrated circuit has a flowing current during partial periods in the two cases.

Figure 10:
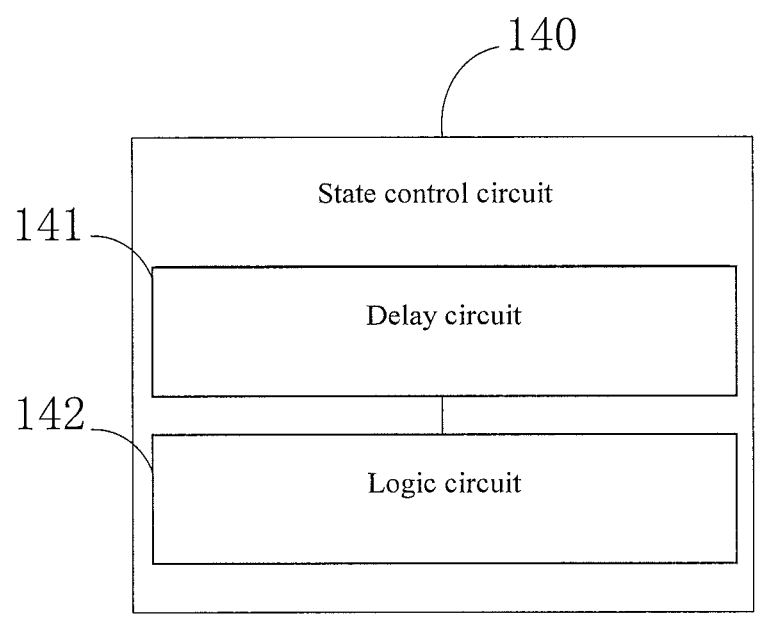
FIG. 10 is a schematic structural diagram of a state control circuit according to an embodiment of the present disclosure.

In the embodiments of the present disclosure, in order to ensure the reliability of a signal outputted by the magnetic sensor integrated circuit, which one of the first state, the second state and the third state the output control circuit 130 operates in depends on whether the magnetic sensor integrated circuit meets the predetermined condition, as long as it is ensured that a correct signal can be generated and outputted before the magnetic sensor integrated circuit meets the predetermined condition. For example, as shown in FIG. 10, in an embodiment, whether the magnetic sensor integrated circuit meets the predetermined condition may be determined via a delay circuit 141. The state control circuit 140 includes the delay circuit 141.

An input terminal of the delay circuit 141 is connected to an output terminal of the voltage detection circuit. The delay circuit 141 is configured to start time counting on obtaining the control signal outputted by the voltage detection circuit. In a case that the counted time reaches a predetermined time, it is indicated that the magnetic sensor integrated circuit meets the predetermined condition, and in a case that the counted time does not reach the predetermined time, it is indicated that the magnetic sensor integrated circuit does not meet the predetermined condition.

More specifically, the control signal outputted by the voltage detection circuit 120 may be a trigger signal generated when the supply voltage for the magnetic field detection circuit 110 reaches the predetermined value.

Reference is made to FIG. 10. The state control circuit 140 further includes a logic circuit 142. The logic circuit 142 is configured to cause, after the counted time of the delay circuit 141 reaches the predetermined time, the output control circuit 130 to at least respond to the magnetic field inductive signal, to allow a load current flow through the output port B.

In the embodiment, after the supply voltage for the magnetic field detection circuit 110 reaches the predetermined value, various modules of the magnetic field detection circuit 110 can normally operate, and a certain processing time is still required to ensure a signal outputted by the magnetic field detection circuit 110 to be correct. Therefore, the state control circuit 140 is provided with the delay circuit 141 to perform time counting. The output control circuit 130 is controlled to at least respond to the magnetic field inductive signal after the predetermined time, thereby ensuring that the state at the output port B is correct and reliable.

Figure 11:
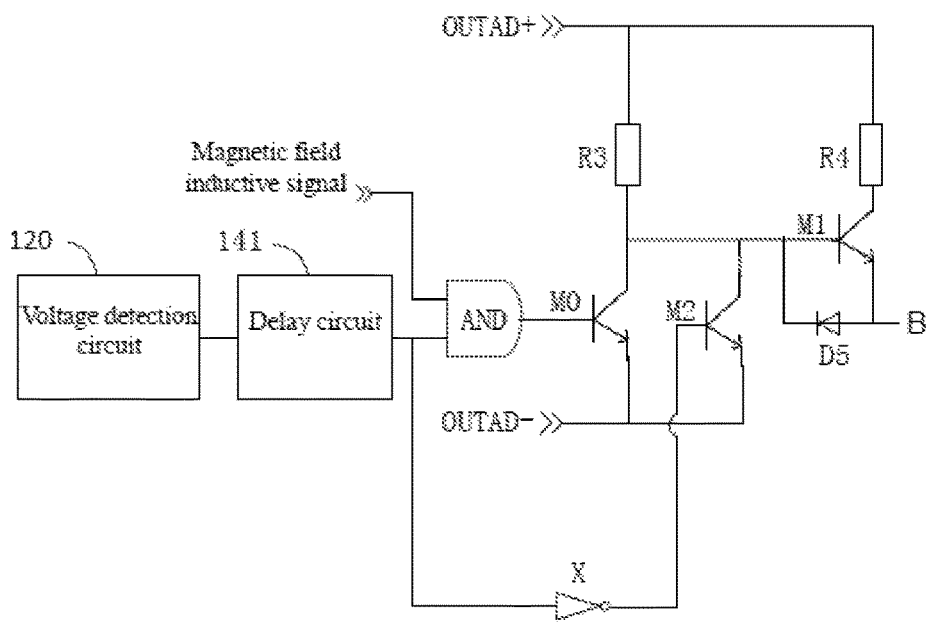
FIG. 11 is a schematic structural diagram of an output control circuit according to another embodiment of the present disclosure.

FIG. 11 schematically illustrates a detailed circuit of the state control circuit 140 and above output control circuit 130 described above. The logic circuit 142 of the state control circuit 140 includes an AND gate. An input terminal of the AND gate is connected to the magnetic field inductive signal, and the other input terminal of the AND gate is connected to an output terminal of the delay circuit 141. The output control circuit 130 includes three switches M0, M1 and M2 which are turned on at a high level, and a diode D5. A control terminal of the switch M0 is connected to an output terminal of the AND gate, an input terminal of the switch M0 is connected to a voltage output terminal (OUTAD+) of the rectifier 150 via a resistor R3, and an output terminal of the switch M0 is connected to a grounded output terminal (OUTAD−) of the rectifier 150. A control terminal of the switch M1 is connected to the input terminal of the switch M0, an input terminal of the switch M1 is connected to the voltage output terminal of the rectifier 150 via a resistor R4, and an output terminal of the switch M1 is connected to the output port B. An input terminal of the diode D5 is connected to the input terminal of the switch M0, and an output terminal of the diode D5 is connected to the output port B. The switch M2 is connected in parallel with the switch M0, and a control terminal of the switch M2 is connected to the output terminal of the delay circuit 141 via a phase inverter X.

In the embodiment, an equivalent resistance of the switch M2 is higher than that of the switch M0, and the switch M2 can be functionally regarded as a part of the state control circuit 140. In a case that the delay time of the delay circuit 141 does not reach the predetermined time, the magnetic sensor integrated circuit is in the third state, the delay circuit 141 outputs a low level, the AND gate outputs a low level all the time, the switches M0 and M1 are turned off, the switch M2 is turned on, and a current flows from the outside into the output port B and flows through the diode D5 and the switch M2. Since the equivalent resistance of the switch M2 is large, the current in this case is very low and can be basically ignored. In a case that the delay time of the delay circuit 141 reaches the predetermined time, the delay circuit 141 outputs a high level, and the magnetic field inductive signal outputted by the magnetic field detection circuit 110 may be outputted to the switch M0 via the AND gate. In a case that a signal outputted by the alternating current power supply is in a positive half-cycle and the magnetic field detection circuit 130 outputs a low level, the switch M0 is turned off, the switches M1 and M2 are turned on, and the load current flows from the output port B to the outside through the switch M1. In a case that the signal outputted by the alternating current power supply is in a negative half-cycle and the magnetic field detection circuit 130 outputs a high level, the switch M0 is turned on, the switches M1 and M2 are turned off, and the load current flows from the outside into the output port B and flows through the diode and the switch M0.

Figure 12:
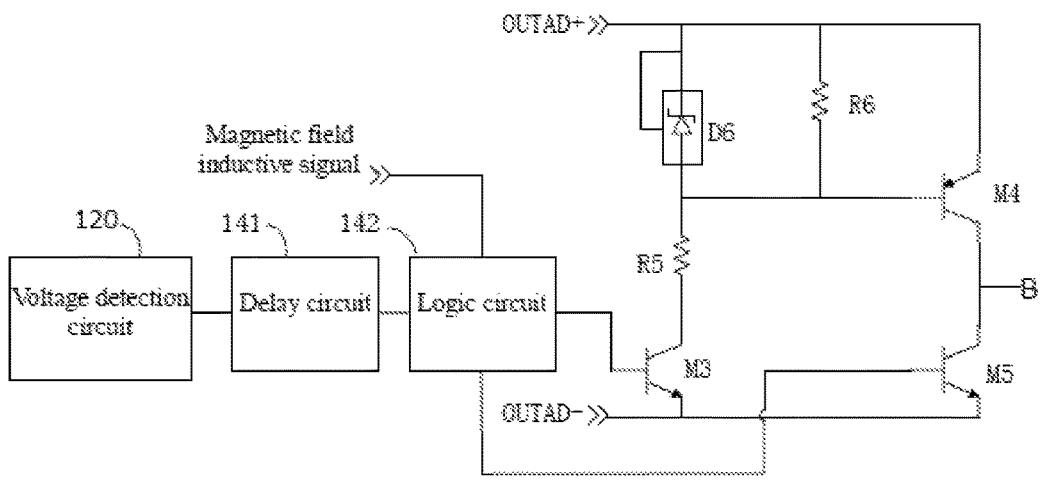
FIG. 12 is a schematic structural diagram of an output control circuit according to still another embodiment of the present disclosure.

FIG. 12 schematically illustrates a detailed circuit of the state control circuit 140 and the output control circuit 130. The logic circuit 142 of the state control circuit 140 has two signal input terminals and two signal output terminals. One of the signal input terminals is connected to an output terminal of the delay circuit 141, and the other of the signal input terminals is connected to the magnetic field inductive signal. The control logic of the logic circuit 142 may be configured as: in a case that the delay time of the delay circuit 141 does not reach the predetermined time, the delay circuit 141 outputs a low level, and two output signals of the logic circuit 142 are both at a low level. In a case that the delay time of the delay circuit 141 reaches the predetermined time, the delay circuit 141 outputs a high level, the two output signals of the logic circuit 142 have opposite phases, and one of the two output signals is the magnetic field inductive signal. A situation in which the two output signals of the logic circuit 142 are both at a high level is forbidden.

The output control circuit 130 includes three switches M3, M4 and M5. The switches M3 and M5 are switches turned on at a high level, and the switch M4 is a switch turned on at a low level. Control terminals of the switches M3 and M5 are respectively connected to the two signal output terminals of the logic circuit 142, an input terminal of the switch M3 is connected to a terminal of a resistor R5, and an output terminal of the switch M3 is connected to a grounded output terminal (OUTAD−) of the rectifier 150. A control terminal of the switch M4 is connected to the other terminal of a resistor R5, an input terminal of the switch M4 is connected to a voltage output terminal (OUTAD+) of the rectifier 150, an output terminal of the switch M4 is connected to an input terminal of the switch M5, and an output terminal of the switch M5 is grounded. A connection point of the output terminal of the switch M4 and the input terminal of the switch M5 is connected to the output port B. The control terminal of the switch M4 is connected to a positive electrode of a protection diode D6, and the input terminal of the switch M4 is connected to a negative electrode of the protection diode D6. A resistor R6 connected in parallel with the protection diode D6 is connected between the control terminal and the input terminal of the switch M4. In a case that the delay time of the delay circuit 141 does not reach the predetermined time, the magnetic sensor integrated circuit is in the third state, the delay circuit 141 outputs a low level, the two output signals of the logic circuit 142 are both at a low level, the switches M3, M4 and M5 are turned off, and no current flows through the output port B. In a case that the delay time of the delay circuit 141 reaches the predetermined time, the delay circuit 141 outputs a high level, the two output signals of the logic circuit 142 have opposite phases, and one of the two output signals is the magnetic field inductive signal. In a case that a signal outputted by the alternating current power supply is in a positive half-cycle and the magnetic field detection circuit 110 outputs a high level, the switches M3 and M4 are turned on, the switch M5 is turned off, and the load current flows from the output port B to the outside through the switch M4. In a case that the signal outputted by the alternating current power supply is in a negative half-cycle and the magnetic field detection circuit 110 outputs a low level, the switches M3 and M4 are turned off, the switch M5 is turned on, and the load current flows from the outside into the output port B through the switch M5.

A motor component applying the magnetic sensor integrated circuit described above is further provided according to the present disclosure. The motor component may include a motor and a motor drive circuit. The motor drive circuit includes the magnetic sensor integrated circuit according to any one of the above embodiments.

Figure 13:
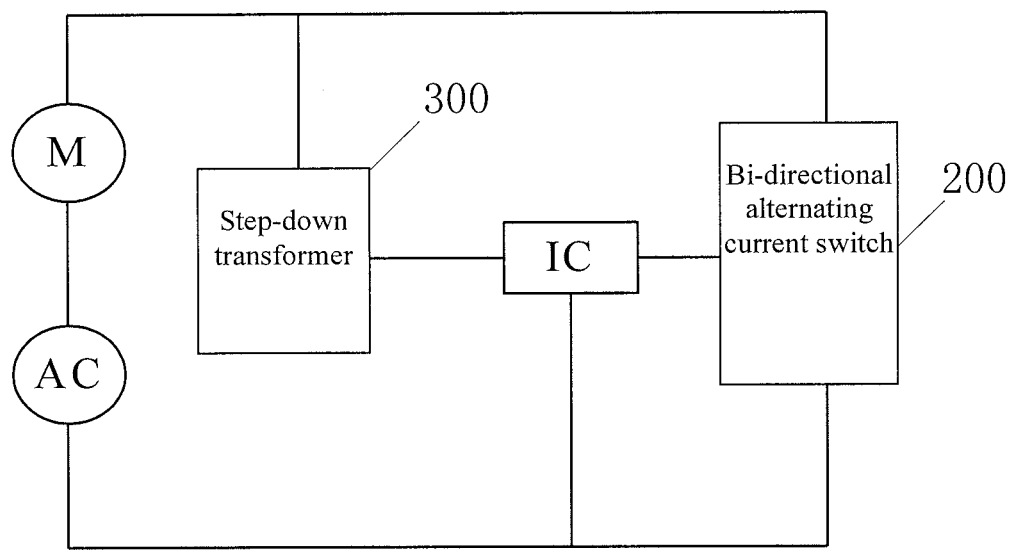
FIG. 13 is a schematic structural diagram of a motor component according to an embodiment of the present disclosure.

Reference is made to FIG. 13. In a preferred embodiment, the motor component may include a motor M powered by an alternating current power supply AC, a bi-directional alternating current switch 200 connected in series with the motor M, and the magnetic sensor integrated circuit IC according to the above embodiments, where the output port B of the magnetic sensor integrated circuit IC is connected to a control terminal of the bi-directional alternating current switch 200.

Preferably, the bi-directional alternating current switch 200 may be a triode alternating current switch (TRIAC). It should be understood that, the bidirectional switch may be realized by other types of suitable switches, e.g., the bidirectional switch may include two anti-parallel silicon-controlled rectifiers, a corresponding control circuit is provided, and an output signal of the output port of the magnetic sensor integrated circuit flows through the control circuit and controls the two silicon-controlled rectifiers in a preset way.

Figure 14:
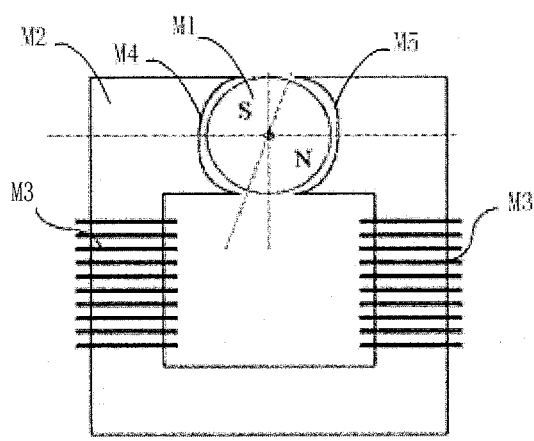
FIG. 14 is a schematic structural diagram of a motor according to an embodiment of the present disclosure.

On the basis of the above embodiments, in a specific embodiment of the present disclosure, the motor is a synchronous motor. It should be understood that, the magnetic sensor integrated circuit is applicable to the synchronous motor as well as other types of permanent magnet motors such as a brushless DC motor. FIG. 14 illustrates a specific example of the synchronous motor. The synchronous motor includes a stator and a rotor M1 which is rotatable relative to the stator. The stator has a stator core M2 and a single-phase stator winding M3 wound on the stator core M2. The stator core M2 may be made of soft magnetic materials such as pure iron, cast iron, cast steel, electrical steel, and silicon steel. The rotor M1 includes a permanent magnet. If the stator winding M3 is connected in series with an alternating current power supply, the rotor operates at a constant rotational speed of 60 f/p revs/minute during a steady state, where f is a frequency of the alternating current power supply and p is the number of pole pairs of the rotor. The stator core M2 has two poles opposite to each other. Each of the poles has a pole arc (M4 and M5). An outer surface of the rotor M1 is opposite to the pole arc (M4 and M5), and a non-uniform air gap is formed between the outer surface of the rotor M1 and the pole arc. A concave starting groove is arranged on the pole arc (M4 and M5) of the pole of the stator, and the other part of the pole arc except the starting groove is concentric with the rotor. With the configuration described above, a non-uniform magnetic field may be formed, which ensures that a pole axis of the rotor has an angle of inclination relative to a central axis of the pole of the stator when the rotor is at rest, so that the rotor has a starting torque every time the motor M is powered under an action of the integrated circuit IC. The pole axis of the rotor M1 refers to a boundary line between two magnetic poles of the rotor having different polarities. The central axis of the pole of the stator refers to a connection line passing through centers of the two pole of the stator. In the embodiment, the stator and the rotor M1 each include two magnetic poles. It can be understood that, in more embodiments, the number of magnetic poles of the stator may not be equal to the number of magnetic poles of the rotor, and the stator and the rotor may have more magnetic poles, such as 4 or 6 magnetic poles.

Preferably, the motor component further includes a step-down transformer 300 configured to drop a voltage of the alternating current power supply and provide the dropped voltage to the magnetic sensor integrated circuit IC. The magnetic sensor integrated circuit IC is arranged near the permanent magnetic rotor of the motor M to sense a change of the magnetic field of the permanent magnetic rotor. A voltage drop across the step-down transformer 300 is higher than the supply voltage for the magnetic field detection circuit 110 in the magnetic sensor integrated circuit.

In the embodiment of the present disclosure, the magnetic field detection circuit 110 and the voltage detection circuit 120 operate simultaneously. In this case, as the magnetic field detection circuit 110 is turned on, and an effect on the supply voltage by the step-down transformer 300 has been included in the process of the supply voltage for the magnetic field detection circuit rising to a steady state, the magnetic sensor integrated circuit has a fast response speed. On the contrary, if the magnetic field detection circuit is configured to be powered to operate after the voltage detection circuit detects that the supply voltage for the magnetic field detection circuit reaches the predetermined value, a large drop of the supply voltage for the magnetic field detection circuit may be generated due to the step-down transformer 300 in the in power process, and the supply voltage needs to be increased to the steady state again, which results in a decreased response speed of the magnetic sensor integrated circuit.

In an embodiment of the present disclosure, if the magnetic sensor integrated circuit IC meets the above predetermined condition, the output control circuit 130 is configured to turn on the bi-directional alternating current switch 200, in a case that the alternating current power supply is in a positive half-cycle and the magnetic field detection circuit 110 detects that the magnetic field of the permanent magnetic rotor M1 has a first polarity, or in a case that the alternating current power supply is in a negative half-cycle and the magnetic field detection circuit 110 detects that the magnetic field of the permanent magnetic rotor M1 has a second polarity opposite to the first polarity, thereby turning on the bi-directional alternating current switch 200. The output control circuit 130 is configured to control the bi-directional alternating current switch 200 to be turned off, in a case that the alternating current power supply is in a negative half-cycle and the permanent magnetic rotor M1 has the first polarity or in a case that the alternating current power supply is in a positive half-cycle and the permanent magnetic rotor M1 has the second polarity.

Preferably, the output control circuit 130 is configured to control a current to flow into the bi-directional alternating current switch 200 from the integrated circuit IC in a case that a signal outputted by the alternating current power supply is in a positive half-cycle and the magnetic field detection circuit 110 detects that the magnetic field of the permanent magnetic rotor M1 has a first polarity, and to control a current to flow into the integrated circuit IC from the bi-directional alternating current switch 200 in a case that the signal outputted by the alternating current power supply is in a negative half-cycle and the magnetic field detection circuit 110 detects that the magnetic field of the permanent magnetic rotor M1 has a second polarity opposite to the first polarity. It should be understood that, the situation that the integrated circuit has a flowing current in a case that the polarity of the permanent magnetic rotor is the first polarity and the alternating current power supply is in the positive half-cycle and, or in a case that the polarity of the permanent magnetic rotor is the second polarity and the alternating current power supply is in the negative half-cycle, may be a situation that the integrated circuit has a flowing current during entire periods in the two cases, or may be a situation that the integrated circuit has a flowing current during partial periods in the two cases.

In a preferred embodiment of the present disclosure, the bidirectional alternating current switch 200 may be a TRIAC, the rectifier 150 adopts a circuit as shown in FIG. 9, and the output control circuit adopts a circuit as shown in FIG. 6. The first switch K1 is a switch turned on at a high level, and the second switch K2 is a switch turned on at a low level. In a case that the magnetic sensor integrated circuit IC meets the predetermined condition, the third switch K3 is turned on. In a case that the magnetic sensor integrated circuit IC does not meet the predetermined condition, the third switch K3 is turned off. The current input terminal of the first switch K1 in the output control circuit is connected to the voltage output terminal of the full wave rectifying bridge, and the current output terminal of the second switch K2 is connected to the grounded output terminal of the full wave rectifying bridge. In a case that the magnetic sensor integrated circuit IC meets the above predetermined condition, and if a signal outputted by the alternating current power supply AC is in a positive half-cycle and the magnetic field detection circuit 130 outputs a high level, the first switch K1 in the output control unit is turned on, the second switch K2 in the output control unit is turned off, and a current flows out from an terminal of the alternating current power supply AC, through the motor M, the step-down transformer 300, a first input terminal of the integrated circuit IC, the voltage output terminal of the second diode D2 of the full wave rectifying bridge and the first switch K1 of the output control circuit 120 in sequence, and flows from the output port B into the bi-directional alternating current switch 200 to back to the alternating current power supply AC. After TRIAC 200 is turned on, a series branch formed by the voltage dropping circuit 300 and the magnetic sensor integrated circuit IC is shorted, the magnetic sensor integrated circuit IC stops outputting due to a lack of power supply. Since a current flowing through the two anodes of the TRIAC 200 is large enough, the TRIAC 200 is still in an on-state in a condition that there is no drive current between a control terminal and a first anode thereof. If the signal outputted by the alternating current power supply AC is in a negative half-cycle and the magnetic field detection circuit 110 outputs a low level, the first switch K1 in the output control unit is turned off, the second switch K2 in the output control unit is turned on, and a current flows from the other terminal of the alternating current power supply AC, and flows from the bi-directional alternating current switch 200 into the output port B through the second switch K2 of the output control circuit 120, the ground output terminal and the first diode D1 of the full wave rectifying bridge, the first input terminal of the magnetic sensor integrated circuit IC, the step-down transformer 300 and the motor M to back to the alternating current power supply AC. Similarly, after the TRIAC 200 is turned on, the magnetic sensor integrated circuit IC stops outputting because the magnetic sensor integrated circuit IC is shorted, and the TRIAC 200 may keep in the on-state. In a case that the signal outputted by the alternating current power supply AC is in a positive half-cycle and the magnetic field detection circuit 110 outputs a low level or in a case that the signal outputted by the alternating current power supply AC is in a negative half-cycle and the magnetic field detection circuit 110 outputs a high level, neither the first switch K1 nor the second switch K2 in the output control circuit 130 can be turned on and the TRIAC 200 is turned off. TRIAC 200. Therefore, the output control circuit 130 can control, based on the polarity change of the alternating current power supply AC and the magnetic field inductive signal, the integrated circuit IC to switch the bi-directional alternating current switch 200 between an on state and an off state in a predetermined manner. In this way, a power mode of the single-phase winding M3 is controlled, and a changing magnetic field generated by the stator matches a magnetic field position of the permanent magnetic rotor, thereby driving the permanent magnetic rotor to rotate in a single direction. Therefore, it is ensured that the permanent magnetic rotor M1 rotates in a fixed direction every time the motor is powered on.

In a motor component according to another embodiment of the disclosure, a motor may be connected in series with a bidirectional switch between tow terminals of an external alternating current power supply, a first series branch formed by the motor and the bidirectional switch is in parallel with a second series branch formed by a voltage dropping circuit and a magnetic sensor integrated circuit. An output terminal of the magnetic sensor integrated circuit is connected to the bidirectional switch, controls the bidirectional switch to switch between an on-state and an off-state in a preset way, and further controls a power mode of a stator winding.

It should be noted that, although the embodiments of the present disclosure are described by taking the integrated circuit IC applied to the motor as an example, the application field of the integrated circuit according to the embodiments of the present disclosure is not limited thereto.

The motor component according to the embodiments of the disclosure may be applied to but not limited to devices such as a pump, a fan, a household appliance and a vehicle, and the household appliance may be, for example, a washing machine, a dishwasher, a smoke exhauster, and an exhaust fan.

The various embodiments in the specification are described in a progressive manner, differences from other embodiments are emphatically illustrated in each embodiment, and reference can be made to each other for understanding the same or similar sections. Since the devices disclosed by the embodiments correspond to the methods disclosed by the embodiments, the devices are described briefly and reference can be made to the descriptions of the methods for understanding related sections.

The above descriptions of the disclosed embodiments enable those skilled in the art to implement or use the disclosure. Various changes to the embodiments are obvious to those skilled in the art and general principle defined herein may be implemented in other embodiments without departing from the spirit or scope of the disclosure. Therefore, the invention is not limited by the embodiments disclosed herein, but is to conform to the widest scope consistent with the principles and the novel features disclosed herein.

The invention claimed is:

1. A magnetic sensor integrated circuit, comprising a housing, a semiconductor substrate arranged inside the housing, input ports and an output port which extend out from the housing, and an electronic circuit arranged on the semiconductor substrate, wherein the electronic circuit comprises:
   a magnetic field detection circuit configured to detect and output a magnetic field inductive signal corresponding to an external magnetic field; and
   a voltage detection circuit configured to detect a specific voltage, and output, in a case that the specific voltage reaches a predetermined value, a control signal for controlling the magnetic sensor integrated circuit to perform a preset action, wherein the specific voltage is a supply voltage for the magnetic field detection circuit; and the voltage detection circuit at least comprises a comparator, wherein an input terminal of the comparator receives the specific voltage, the other input terminal of the comparator receives a reference voltage, and the comparator is configured to output, in a case that the specific voltage is higher than the reference voltage, the control signal for controlling the magnetic sensor integrated circuit to perform a specific action;
   wherein the voltage detection circuit and the magnetic field detection circuit operate simultaneously.

2. The magnetic sensor integrated circuit according to claim 1, wherein the predetermined value is greater than a supply voltage value that enables the magnetic field detection circuit to operate normally.

3. The magnetic sensor integrated circuit according to claim 1, wherein the voltage detection circuit comprises:
- a first resistor and a second resistor connected in series between the specific voltage and the ground;
- a buffer, wherein a non-inverting input terminal of the buffer is connected to a common terminal of the first resistor and the second resistor, and an inverting input terminal of the buffer is connected to an output terminal of the buffer; and
- wherein a non-inverting input terminal of the comparator is connected to the output terminal of the buffer, and an inverting input terminal of the comparator is connected to a reference voltage.

4. The magnetic sensor integrated circuit according to claim 1, wherein the electronic circuit further comprises an output control circuit configured to control, at least based on the magnetic field inductive signal, the magnetic sensor integrated circuit to operate in at least one of a first state in which a current flows from the output port to an outside and a second state in which a current flows into the output port from the outside.

5. The magnetic sensor integrated circuit according to claim 4, wherein the input ports comprise an input port for connecting an external alternating current power supply, and the output control circuit is configured to control, based on a polarity change of the alternating current power supply and the magnetic field inductive signal, the integrated circuit to switch at least between the first state and the second state.

6. The magnetic sensor integrated circuit according to claim 4, wherein the output control circuit comprises a first switch and a second switch, the first switch and the output port are connected in a first current path, the second switch and the output port are connected in a second current path having a direction opposite to that of the first current path, and the first switch and the second switch are selectively turned on under the control of the magnetic field inductive signal.

7. The magnetic sensor integrated circuit according to claim 4, wherein the output control circuit comprises a first current path in which a current flows out from the output port, a second current path in which a current flows in from the output port, and a switch connected in one of the first current path and the second current path, wherein the switch is controlled by the magnetic field detection information outputted by the magnetic field detection circuit, and allows the first current path and the second current path to be selectively turned on.

8. The magnetic sensor integrated circuit according to claim 4, wherein the electronic circuit further comprises a state control circuit configured to in a case that the magnetic sensor integrated circuit meets a predetermined condition, control the output control circuit to operate, at least in response to the magnetic field inductive signal, in at least one of the first state in which a load current flows from the output port to the outside and the second state in which a load current flows into the output port from the outside and in a case that the magnetic sensor integrated circuit does not meet the predetermined condition, control the output control circuit to operate in a third state in which the first state and the second state are prevented.

9. The magnetic sensor integrated circuit according to claim 8, wherein in a case that the output control circuit operates in the third state, the output control circuit makes no response to the magnetic field inductive signal, or, a current at the output port is lower than one fourth of the load current.

10. The magnetic sensor integrated circuit according to claim 8, wherein the state control circuit comprises a delay circuit configured to: start time counting on obtaining the control signal; output a signal indicating that the magnetic sensor integrated circuit meets the predetermined condition, in a case that the counted time reaches a predetermined time; and output a signal indicating that the magnetic sensor integrated circuit does not meet the predetermined condition, in a case that the counted time does not reach the predetermined time.

11. The magnetic sensor integrated circuit according to claim 4, wherein the magnetic field detection circuit comprises:
- a magnetic sensing unit configured to detect and output an analog electrical signal matching the external magnetic field;
- a signal processing unit configured to perform amplification and interference cancellation on the analog electrical signal; and
- an analog-to-digital conversion unit configured to convert the analog electric signal, on which the amplification and the interference cancellation have been performed, into the magnetic field inductive signal.

12. The magnetic sensor integrated circuit according to claim 1, wherein the electronic circuit further comprises a power supply module, the power supply module comprises a rectifier configured to convert an external power supply to a first voltage and a voltage regulating circuit configured to regulate the first voltage to a second voltage, and the magnetic sensor integrated circuit is powered by the second voltage.

13. A motor component, comprising a motor and a motor drive circuit, wherein the motor drive circuit comprises the magnetic sensor integrated circuit according to claim 1.

14. The motor component according to claim 13, wherein the motor drive circuit further comprises a bi-directional alternating current switch connected in series with the motor across an external alternating current power supply, and the output port of the magnetic sensor integrated circuit is connected to a control terminal of the bi-directional alternating current switch.

15. The motor component according to claim 14, wherein the magnetic sensor integrated circuit is configured to control the bi-directional alternating current switch to be turned on in a case that the alternating current power supply is in a positive half-cycle and a magnetic field of the rotor of the motor has a first polarity or in a case that the alternating current power supply is in a negative half-cycle and the magnetic field of the rotor of the motor has a second polarity opposite to the first polarity, and to control the bi-directional alternating current switch to be turned off in a case that the alternating current power supply is in a negative half-cycle and the magnetic field of the rotor of the motor has the first polarity or in a case that the alternating current power supply is in a positive half-cycle and the magnetic field of the rotor of the motor has the second polarity.

16. The motor component according to claim 15, wherein the magnetic sensor integrated circuit is configured to control a current to flow from the integrated circuit to the bi-directional alternating current switch in a case that a signal outputted by the alternating current power supply is in a positive half-cycle and the magnetic field of the rotor of the motor has the first polarity, and to control a current to flow from the bi-directional alternating current switch to the integrated circuit in a case that the signal outputted by the alternating current power supply is in a negative half-cycle and the magnetic field of the permanent magnetic rotor has the second polarity opposite to the first polarity.

17. The motor component according to claim 13, wherein the motor comprises a stator and a permanent magnetic rotor, and the stator comprises a stator core and a single-phase winding wound on the stator core.

18. The motor component according to claim 13, wherein the motor component further comprises a step-down transformer configured to drop a voltage of the power supply of the motor and provide the dropped voltage to the magnetic sensor integrated circuit.

19. The motor component according to claim 18, wherein a voltage drop across the step-down transformer is higher than the supply voltage for the magnetic field detection circuit in the magnetic sensor integrated circuit.

20. A magnetic sensor integrated circuit, comprising a housing, a semiconductor substrate arranged inside the housing, input ports and an output port which extend out from the housing, and an electronic circuit arranged on the semiconductor substrate, wherein the electronic circuit comprises:

a magnetic field detection circuit configured to detect and output a magnetic field inductive signal corresponding to an external magnetic field; and a voltage detection circuit configured to detect a specific voltage, and output, in a case that the specific voltage reaches a predetermined value, a control signal for controlling the magnetic sensor integrated circuit to perform a preset action; and wherein the magnetic field detection circuit comprises:

a magnetic sensing unit configured to detect and output an analog electrical signal matching the external magnetic field;

a signal processing unit configured to perform amplification and interference cancellation on the analog electrical signal; and an analog-to-digital conversion unit configured to convert the analog electric signal, on which the amplification and the interference cancellation have been performed, into the magnetic field inductive signal.

\* \* \* \* \*